United States Patent
Inomata et al.

(10) Patent No.: US 7,554,191 B2
(45) Date of Patent: Jun. 30, 2009

(54) SEMICONDUCTOR DEVICE HAVING A HEATSINK PLATE WITH BORED PORTIONS

(75) Inventors: Teruji Inomata, Kanagawa (JP); Yoshiaki Sanada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 57 days.

(21) Appl. No.: 11/648,539

(22) Filed: Jan. 3, 2007

(65) Prior Publication Data

US 2007/0152322 A1    Jul. 5, 2007

(30) Foreign Application Priority Data

Jan. 5, 2006    (JP)    ............... 2006-000512

(51) Int. Cl.
*H01L 23/10*    (2006.01)
(52) U.S. Cl. ............... 257/706; 257/E23.101
(58) Field of Classification Search ............ 257/706, 257/713, 276, 675, E29.119, E23.101
See application file for complete search history.

(56) References Cited

U.S. PATENT DOCUMENTS 5,656,864 A * 8/1997 Mitsue et al. ............ 257/787

6,770,961 B2 * 8/2004 Lee ............... 257/687

FOREIGN PATENT DOCUMENTS

| JP | 2001-168244 | 6/2001 |
|---|---|---|
| JP | 2001-210761 | 8/2001 |
| JP | 2002-134669 | 5/2002 |
| JP | 2004-165586 | 6/2004 |

* cited by examiner

*Primary Examiner*—Wai-Sing Louie
*Assistant Examiner*—Bilkis Jahan
(74) *Attorney, Agent, or Firm*—Young & Thompson (57) ABSTRACT

A heatsink plate is to be fixed to a substrate with sufficient strength, so as to prevent the heatsink plate from being stripped off, to thereby secure reliability on the performance of the semiconductor chip. The heatsink plate has both the upper and lower surfaces of the fixing section sandwiched by an adhesive resin. Such structure provides an increased adhesion area between the heatsink plate and the upper surface of the substrate, thereby securing greater fixing strength compared with the conventional structure in which simply the lower surface of the heatsink plate and the upper surface of the substrate are adhered to each other. Accordingly, the heatsink plate can be fixed to the upper surface of substrate with greater strength.

1 Claim, 8 Drawing Sheets

SEMICONDUCTOR DEVICE HAVING A HEATSINK PLATE WITH BORED PORTIONS

This application is based on Japanese patent application No. 2006-000512, the content of which is incorporated hereinto by reference.

BACKGROUND

1. Technical Field

The present invention relates to a semiconductor device with a heatsink plate and to a method of manufacturing such semiconductor device, and more particularly to a technique of fixing the heatsink plate to the substrate.

2. Related Art

In recent years, a semiconductor device of a Ball Grid Array (hereinafter, BGA) package structure has been focused on because of the advantage it offers in achieving both higher integration level and superior performance.

Figure 5A:
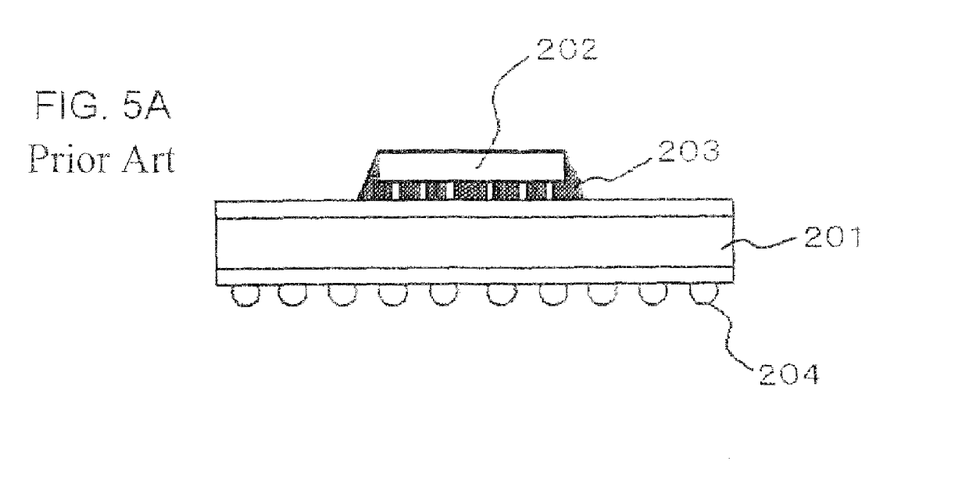
FIG. 5A is a vertical cross-sectional view and FIG. 5B is a plan view, each schematically showing a structure of a conventional BGA semiconductor device.

To start with, a structure of the BGA semiconductor device will be reviewed. FIG. 5A is a vertical cross-sectional view schematically showing the structure of the BGA semiconductor device, and FIG. 5B is a schematic plan view thereof.

Figure 5B:
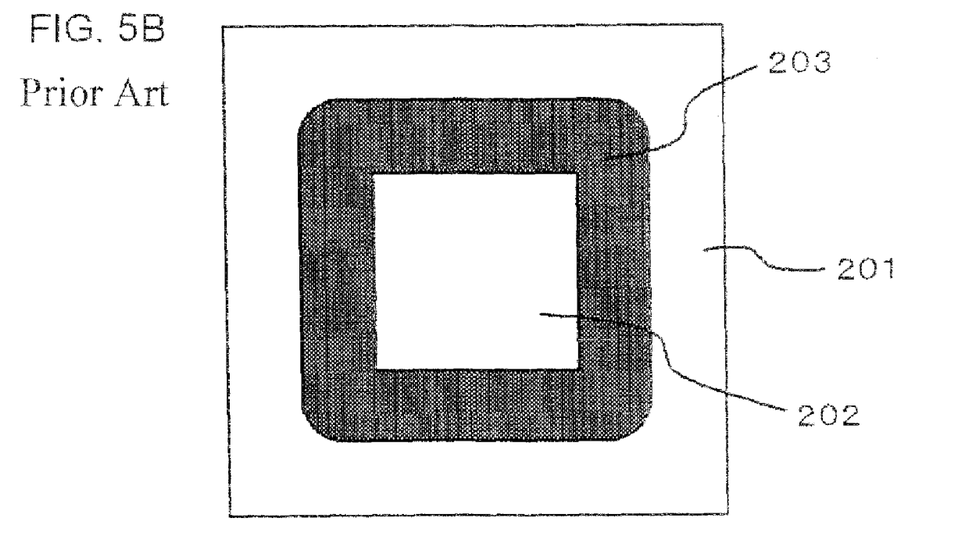

As shown in FIGS. 5A and 5B, the BGA semiconductor device includes a substrate 201 with a semiconductor chip 202 mounted thereon, such that the substrate 201 and the semiconductor chip 202 are electrically connected via a solder or a gold bump, with the gap therebetween encapsulated with an underfill resin 203. On the lower surface of the substrate 201 a plurality of electrodes electrically connected to the semiconductor chip 202 is formed, and on those electrodes solder bumps 204 are provided so as to serve as external electrodes. The solder bumps 204 are aligned in an array on the lower surface of the substrate 201, and hence a larger number of external electrodes can be obtained than in a Quad Flat Package (hereinafter, QFP) semiconductor device, which means that the package size can be reduced compared with the QFP semiconductor device, when the required number of external electrodes is the same.

The BGA semiconductor device is mounted at a predetermined position on a mounting substrate, and the BGA semiconductor device and the mounting substrate are subjected to heat treatment so as to reflow the solder bump 204, to thereby achieve electrical connection between the BGA semiconductor device and electrodes on the mounting substrate.

Meanwhile, the ongoing rapid diffusion of the internet and intranet has been creating demand for higher performance of the semiconductor chips mounted on the semiconductor devices. On the other hand, quicker operation of the semiconductor chip leads to increased heat generation from the circuit actions, thereby degrading reliability on the performance. Accordingly, techniques of providing a heatsink plate that dissipates the heat generated in the semiconductor chip have been proposed, so as to upgrade the reliability on the performance of the semiconductor device. To cite a few examples, a semiconductor device according to JP-A No. 2001-210761 includes a sheet-shaped heatsink plate constituted of a heat-resistant resin containing carbon fiber as a reinforcing material. JP-A No. 2001-168244 proposes employing a laser welding method for bonding a heat spreader (heatsink plate) to a semiconductor device. In a semiconductor device according to JP-A No. 2002-134669, a lid with radiation fins mounted thereon and an insulating substrate are adhered with adhesive resins of different Young's modulus. Also, JP-A No. 2004-165586 discloses a package structure, as well as a printed circuit board with the package mounted thereon, including a heat spreader that transmits heat from an LSI to a heat sink.

Figure 6A:
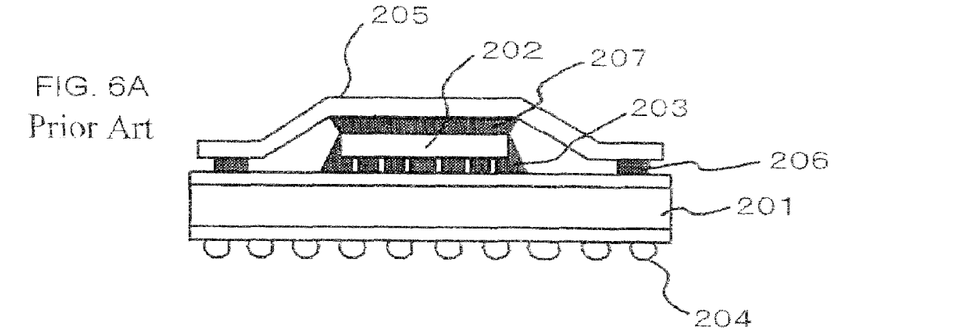
FIG. 6A is a vertical cross-sectional view and FIG. 6B is a plan view, each schematically showing a structure of a conventional BGA semiconductor device with a heatsink plate.
Figure 6B:
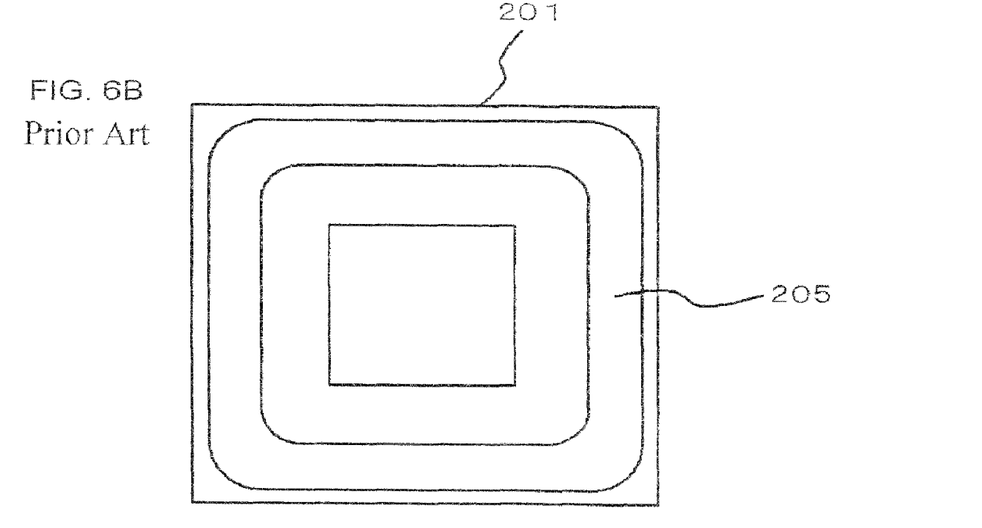
Figure 6C:
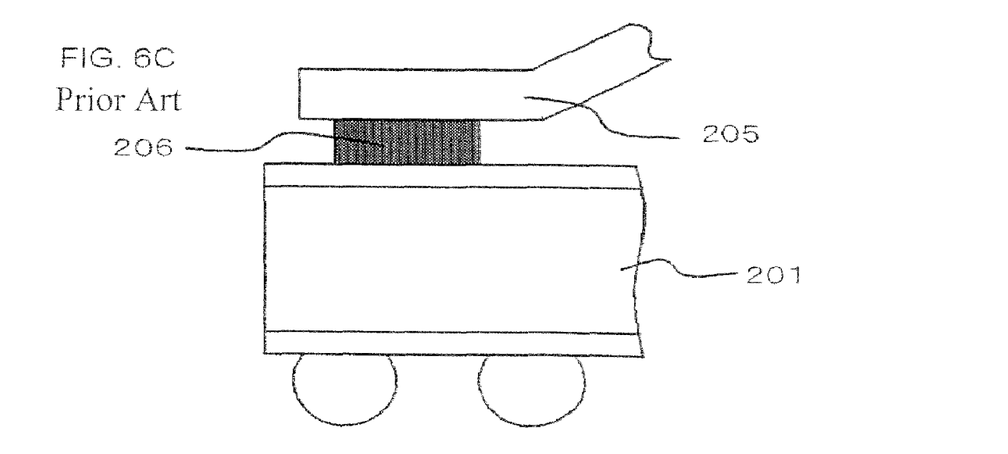
FIG. 6C is an enlarged fragmentary vertical cross-sectional view thereof.

Accordingly, a structure of the BGA semiconductor device including the heatsink plate will be described. FIG. 6A is a vertical cross-sectional view and FIG. 6B is a plan view, each schematically showing a structure of a conventional BGA semiconductor device with a heatsink plate. FIG. 6C is an enlarged fragmentary vertical cross-sectional view of the BGA semiconductor device.

As shown in FIGS. 6A and 6B, the BGA semiconductor device includes a heatsink plate 205 overlaid on the semiconductor chip 202 mounted on the substrate 201, and the heatsink plate 205 is fixed to the upper surface of the semiconductor chip 202 via an adhesive resin or an adhesive agent 207 such as alumina paste or silver paste, and to the upper surface of the substrate 201 via an adhesive resin 206 as shown in FIG. 6C.

In such BGA semiconductor device, however, the package is warped as a whole during the reflow process of the solder bump 204. This is mainly because of a difference in thermal expansion coefficient between the semiconductor chip 202 and the substrate 201. In addition, a difference in thermal expansion coefficient between the semiconductor chip 202 and the underfill resin 203 may be partially responsible for the warp. More specifically, the greater thermal expansion coefficient of the substrate 201 and the underfill resin 203 than that of the semiconductor chip 202 is the cause of the warp.

Figure 7A:
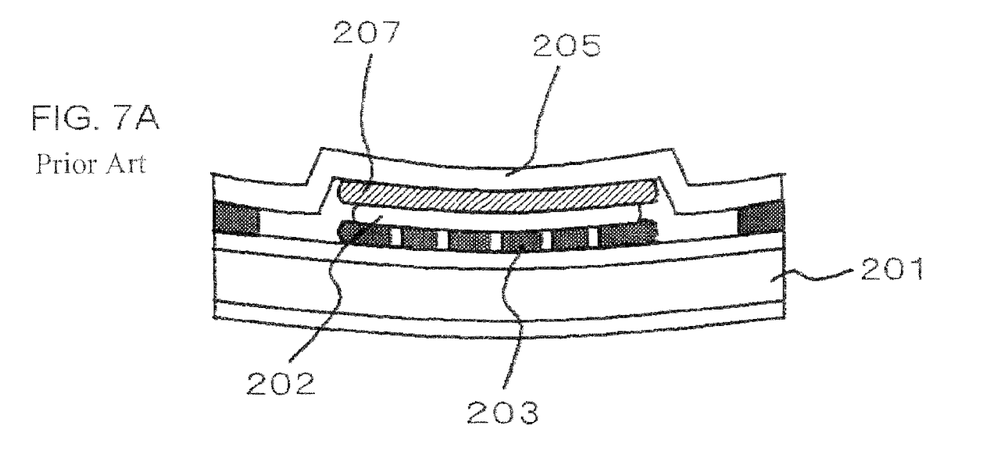
FIG. 7A is a vertical cross-sectional view and FIG. 7B is an enlarged fragmentary vertical cross-sectional view, each schematically showing the conventional BGA semiconductor device warped during a reflow process (under high temperature)
Figure 7B:
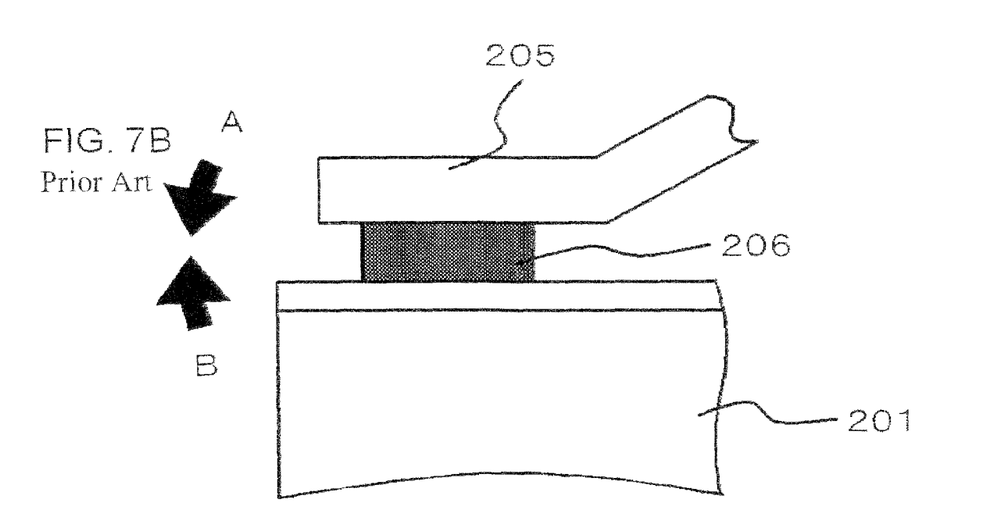
Figure 8A:
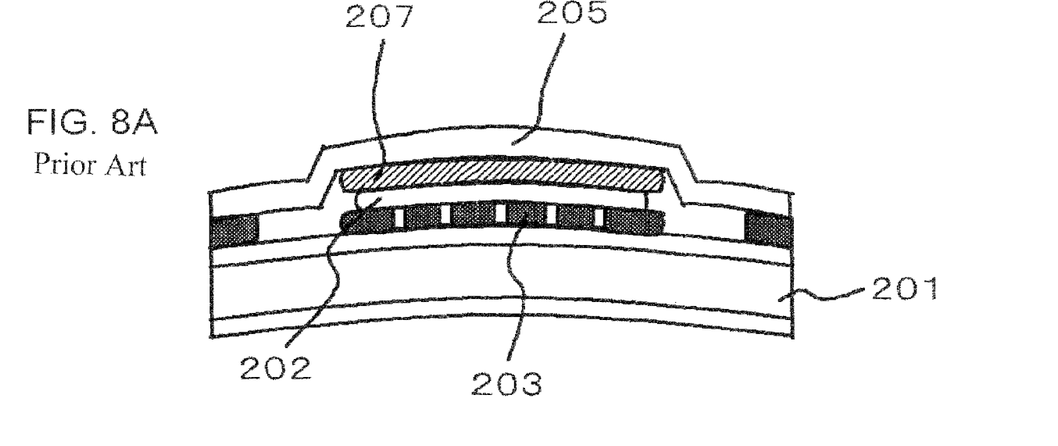
FIG. 8A is a vertical cross-sectional view and FIG. 8B is an enlarged fragmentary vertical cross-sectional view, each schematically showing the conventional BGA semiconductor device warped during a cooling phase of the reflow process (from low to room temperature).
Figure 8B:
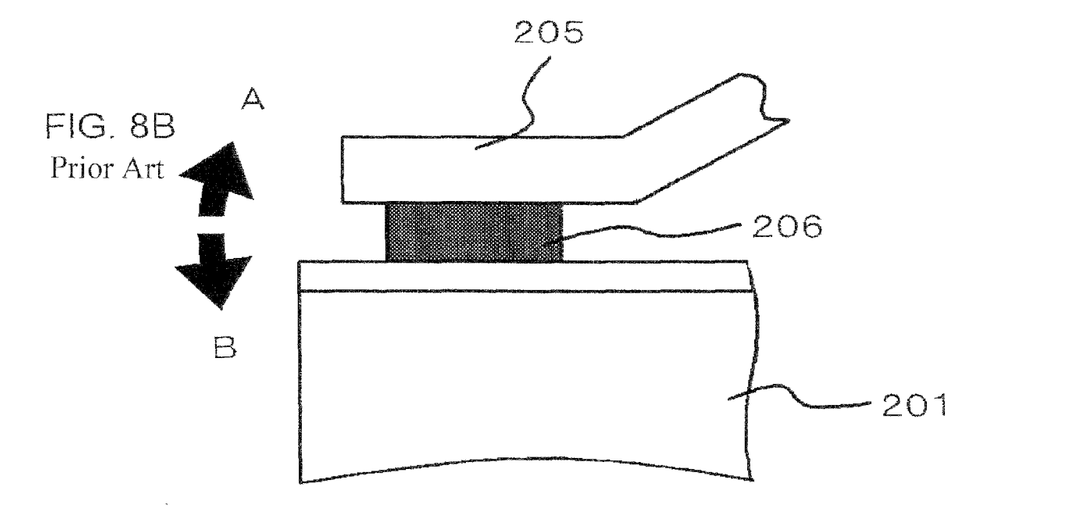

Specific warp status of the BGA semiconductor device during the reflow process will be described hereunder. FIG. 7A is a vertical cross-sectional view schematically showing the conventional BGA semiconductor device warped during the reflow process (under high temperature), and FIG. 7B is an enlarged fragmentary vertical cross-sectional view thereof. FIG. 8A is a vertical cross-sectional view schematically showing the conventional BGA semiconductor device warped during a cooling phase of the reflow process (from low to room temperature), and FIG. 8B is an enlarged fragmentary vertical cross-sectional view thereof.

As shown in FIG. 7A, during the reflow process (under high temperature), the BGA semiconductor device suffers a warp in the direction as illustrated, because of the difference in thermal expansion coefficient between the semiconductor chip 202 and the substrate 201, and also the difference in thermal expansion coefficient between the semiconductor chip 202 and the underfill resin 203. At this moment, as shown in FIG. 7B, a stress is applied to the adhesive resin 206 joining the heatsink plate 205 and the substrate 201 from the lower surface of the heatsink plate 205 and the upper surface of the substrate 201, as indicated respectively by arrows A, B (in a compressing direction).

In contrast as shown in FIG. 8A, in the cooling phase of the reflow process (from low to room temperature), likewise, the BGA semiconductor device suffers a warp in the direction as illustrated, because of the difference in thermal expansion coefficient between the semiconductor chip 202 and the substrate 201, and also the difference in thermal expansion coefficient between the semiconductor chip 202 and the underfill resin 203. At this moment, as shown in FIG. 8B, a stress is applied to the adhesive resin 206 joining the heatsink plate 205 and the substrate 201 from the lower surface of the heatsink plate 205 and the upper surface of the substrate 201, as indicated by arrows A, B (in an elongating direction).

Thus, in the cooling phase of the reflow process (from low to room temperature), since the stress is applied to the adhesive resin 206 joining the heatsink plate 205 and the substrate 201 in the direction to strip off the heatsink plate 205 from the upper surface of the substrate 201 (elongating direction), the heatsink plate 205 is often stripped off from the upper surface of the substrate 201. When the heatsink plate 205 is thus stripped off from the upper surface of the substrate 201, the heatsink plate 205 becomes less closely pressed against the semiconductor chip 202, which leads to insufficient thermal contact between the heatsink plate 205 and the semiconductor chip 202. Besides, in case that the separation of the heatsink plate 205 from the upper surface of the substrate 201 further leads to emergence of a crack or fracture in the adhesive agent 207, which is now the only member retaining the heatsink plate 205, the thermal contact between the heatsink plate 205 and the semiconductor chip 202 becomes further deteriorated. Therefore, the heatsink plate 205 can no longer effectively dissipate the heat from the semiconductor chip 202, thus resulting a difficulty to secure the reliability on the performance of the BGA semiconductor device.

In the conventional BGA semiconductor device, as reviewed referring to FIGS. 7B and 8B, the lower surface of the heatsink plate 205 is fixed to the upper surface of the substrate 201 via the adhesive resin 206. Thus, while the anchor effect provided by the adhesive resin 206 is the only fixing means of the heatsink plate 205 to the substrate 201, it is not desirable to increase the footprint of the heatsink plate 205, from the viewpoint of reducing the package size as much as possible. Consequently, the structure of the conventional BGA semiconductor device result in a difficulty to maintain sufficient fixing strength of the heatsink plate 205 against the stress in the direction to strip off the heatsink plate 205 from the substrate 201 (elongating direction).

SUMMARY OF THE INVENTION

According to the present invention, there is provided a semiconductor device comprising a substrate on which a semiconductor chip is mounted; and a heatsink plate covering said semiconductor chip and fixed to said substrate; wherein said heatsink plate includes one or more bored portions formed on a fixing surface thereof to be fixed to said substrate, thereby being fixed to said substrate via a resin provided in said bored portion.

According to the semiconductor device as such thus constructed, the heatsink plate is fixed to the substrate via the resin filled in the bored portion provided on the fixing surface fixed to the substrate. Such structure provides a larger adhesion area than in the conventional structure in which simply the lower surface of the heatsink plate and the upper surface of the substrate are adhered via the resin, thereby attaining sufficient adhesion strength.

According to the present invention, there is also provided a method of manufacturing a semiconductor device including a heatsink plate fixed to a substrate on which a semiconductor chip is mounted, so as to cover said semiconductor chip, comprising: preparing said substrate on which said semiconductor chip is mounted, and said heatsink plate including one or more bored portions formed on a fixing surface thereof to be fixed to said substrate; applying a resin to said substrate on which said semiconductor chip is mounted; pressing said fixing surface, of said heatsink plate, against said resin applied to said substrate thereby filling said bored portion with said resin; and hardening said resin filled in said bored portion thereby fixing said heatsink plate to said substrate.

By the method as such, the resin is filled in the bored portion provided on the fixing surface of the heatsink plate, so as to fix the heatsink plate to the substrate via that resin. Such method provides a larger adhesion area between the heatsink plate and the substrate than in the conventional structure in which simply the lower surface of the heatsink plate and the upper surface of the substrate are adhered via the resin, thereby attaining sufficient adhesion strength.

Thus, the present invention provides sufficient adhesion strength in fixing the heatsink plate to the substrate, thereby effectively preventing the heatsink plate from being stripped off. Accordingly the heatsink plate can serve to sufficiently dissipate the heat, thus to secure the reliability on the performance of the semiconductor chip.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor device according to the present invention will be described in details, referring to the accompanying drawings. In the drawings, same constituents are given the same numerals, and the description thereof will not be repeated.

First Embodiment

In the semiconductor device according to this embodiment, a heatsink plate includes through holes formed on the fixing surface thereof, so that filling a resin in the through holes allows fixing the heatsink plate to a substrate with greater strength. Here, the bored portion according to the present invention includes a recessed groove or the like, without limitation to the through hole. The semiconductor device according to this embodiment, therefore, may include the recessed grooves instead of the through holes.

Figure 1A:
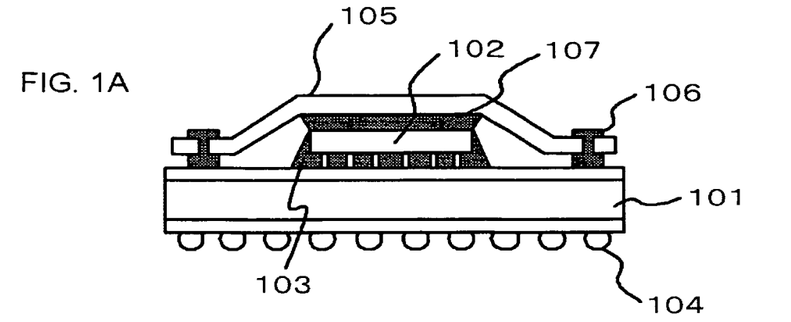
FIG. 1A is a vertical cross-sectional view and FIG. 1B is a plan view, each schematically showing a structure of a semiconductor device according to a first embodiment of the present invention.
Figure 1B:
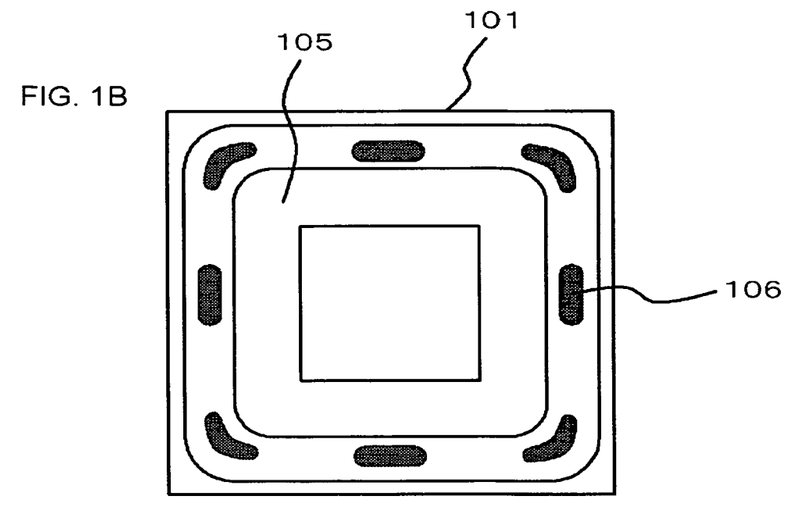
Figure 1C:
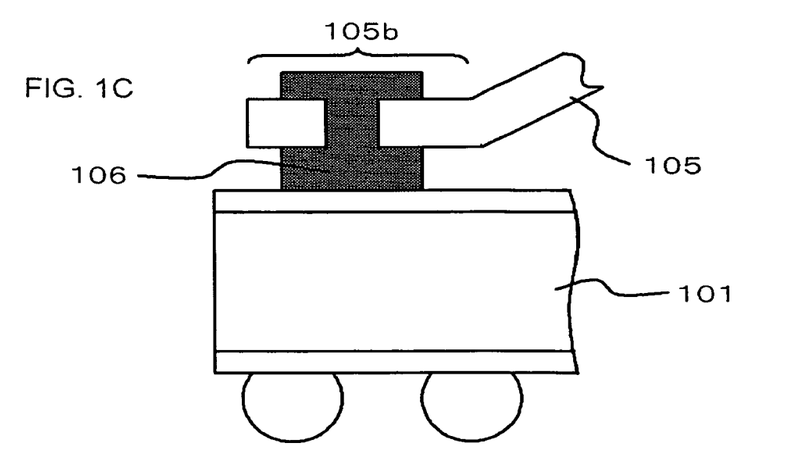
FIG. 1C is an enlarged fragmentary vertical cross-sectional view thereof.

A structure of the semiconductor device will be first described. FIG. 1A is a vertical cross-sectional view and FIG. 1B is a plan view, each schematically showing a structure of a semiconductor device according to this embodiment. FIG. 1C is an enlarged fragmentary vertical cross-sectional view thereof.

As shown in FIG. 1A, the semiconductor device includes a substrate 101 on which an interconnect pattern, and a solder resist serving as a cover layer for the interconnect pattern, are formed, a semiconductor chip 102 mounted on the substrate 101 and electrically connected to the interconnect pattern via a solder or a gold bump, and a heatsink plate 105 overlaid on the semiconductor chip 102. The gap between the upper surface of the substrate 101 and the lower surface of the semiconductor chip 102 is encapsulated with an underfill resin 103. The upper surface of the semiconductor chip 102 is fixed to the lower surface of the heatsink plate 105 via an adhesive resin or an adhesive agent 107 such as alumina paste or silver paste, and the heatsink plate 105 is fixed to the upper surface of the substrate 101 via an adhesive resin 106 loaded in a through hole 105c which will be described later. On the lower surface of the substrate 101 a plurality of electrodes is formed in electrical connection to the semiconductor chip 102, and on the electrodes solder bumps 104 are provided so as to serve as external electrodes. The solder bumps 104 are aligned in an array on the lower surface of the substrate 101. The semiconductor device and a mounting substrate, on which the semiconductor device is mounted at a predetermined position, are subjected to heat treatment so as to reflow the solder bumps 204, to thereby achieve electrical connection between the semiconductor device and electrodes on the mounting substrate.

Figure 2A:
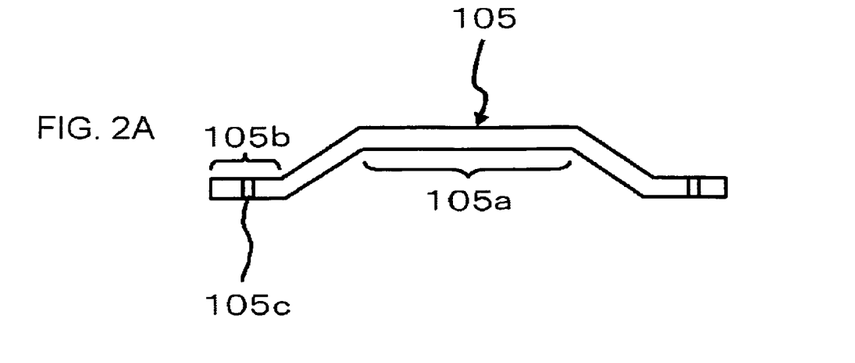
FIG. 2A is a vertical cross-sectional view and FIG. 2B is a plan view, each schematically showing a structure of a heatsink plate.

The heatsink plate 105 is configured as follows. FIG. 2A is a vertical cross-sectional view schematically showing a structure of a heatsink plate, and FIG. 2B is a plan view thereof.

Figure 2B:
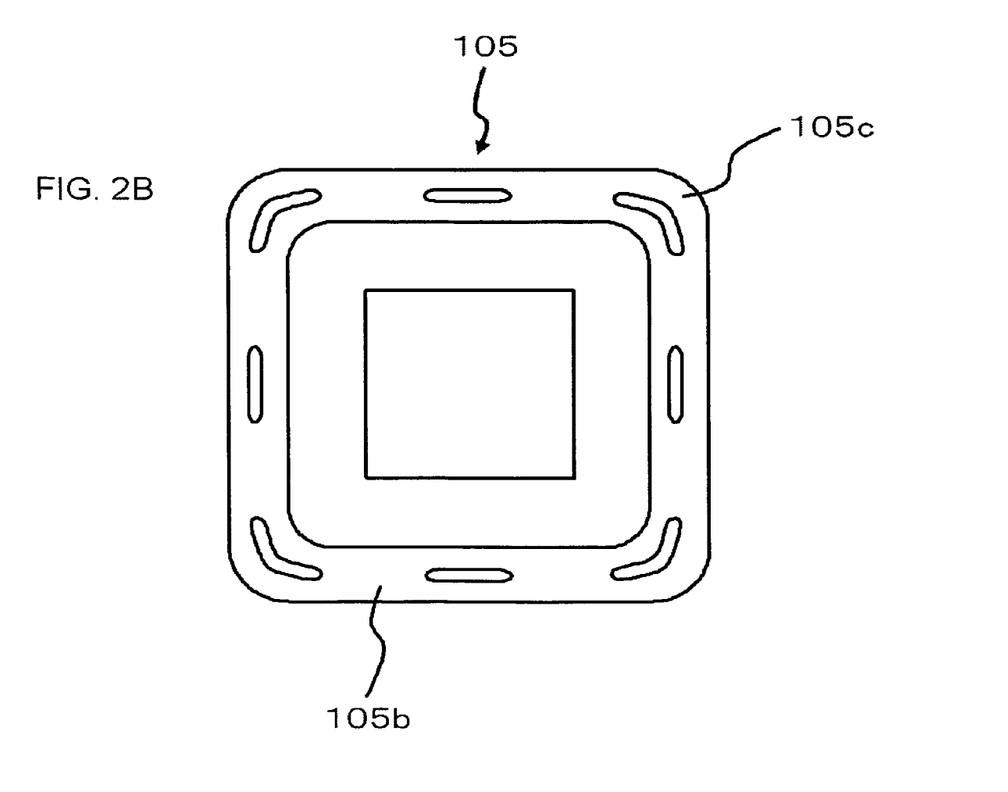

As shown in FIGS. 2A and 2B, the heatsink plate 105 includes a concave portion 105a of a concave shape when viewed from the side of the semiconductor chip 102, in which the semiconductor chip 102 is accommodated, and a fixing section 105b provided around the concave portion 105a including the fixing surface to be fixed to the substrate 101 and also a plurality of through holes 105c formed along the periphery of the fixing section 105b. The through holes 105c may be of a rectangular, a circular or an elliptical shape. Also, the through hole 105c may be of a shape that reaches the outer edge of the heatsink plate 105. The number of the through holes 105c may be just one, in the case where the through hole is formed in a C-shape throughout three sides along the periphery of the heatsink plate 105. In addition, as already stated, the through hole 105c may be substituted with a recessed groove.

Under such configuration, the lower surface of the concave portion 105a of the heatsink plate 105 is fixed to the upper surface of the semiconductor chip 102 via the adhesive agent 107, and the lower surface of the fixing section 105b is fixed to the upper surface of the substrate 101 via the adhesive resin 106 filled in the through hole 105c.

The following passages cover a method of manufacturing the semiconductor device according to this embodiment.

(1) Firstly the semiconductor chip 102 is mounted on the substrate 101, and electrically connected thereto. The gap between the semiconductor chip 102 and the substrate 101 is encapsulated with the underfill resin 103 at this stage.

(2) The adhesive agent 107 is applied to the upper surface of the semiconductor chip 102.

(3) A necessary amount of the adhesive resin 106 is applied beforehand to the upper surface of the substrate 101, at positions where the through holes 105c of the fixing section 105b are to be located when the heatsink plate 105 is placed. More specifically, such amount of the adhesive resin 106, that intrudes halfway into the through hole 105c when the heatsink plate 105 is placed on the upper surface of the substrate 101, is to be applied.

(4) The heatsink plate 105 is placed on the substrate 101 so as to cover the semiconductor chip 102. At this moment, the lower surface of the concave portion 105a of the heatsink plate 105 is pressed against the adhesive agent 107 applied to the upper surface of the semiconductor chip 102, the lower surface of the fixing section 105b of the heatsink plate 105 is pressed against the adhesive resin 106 and the adhesive resin 106 is expanded to occupy a larger area than each of the through holes 105c (when the recessed groove is provided instead of the through hole 105c, the adhesive resin 106 is filled in the recessed groove at this stage).

(5) The adhesive resin 106 is filled in the through holes 105c of the heatsink plate 105.

(6) Further, the adhesive resin 106 is additionally applied to the upper surface of the fixing section 105b of the heatsink plate 105, in a larger diameter than the through holes 105c, so as to cover the through holes 105c.

(7) Heat treatment is then performed, to thereby harden the adhesive resin 106. As a result, the fixing section 105b of the heatsink plate 105 is fixed to the upper surface of the substrate 101, via the adhesive resin 106.

Through the foregoing steps, the semiconductor device shown in FIGS. 1A and 1B can be obtained. Upon completion of the above, the joint portion between the fixing section 105b of the heatsink plate 105 and the upper surface of the substrate 101 presents the structure shown in FIG. 1C. What is important here is that the adhesive resin 106 filled in the through holes 105c of the heatsink plate 105 is expanded to be larger in diameter than the respective through holes 105c, in the gap between the upper surface of the substrate 101 and the lower surface of the fixing section 105b, as well as on the upper surface of the fixing section 105b. Accordingly, the heatsink plate 105 has both the upper and lower surfaces of the fixing section 105b sandwiched by the adhesive resin 106. Such structure provides an increased adhesion area between the heatsink plate 105 and the upper surface of the substrate 101, thereby securing much enough fixing strength compared with the conventional structure in which simply the lower surface of the heatsink plate and the upper surface of the substrate are adhered to each other. Also, the adhesive resin 106 applied to the upper surface of the fixing section 105b in a larger diameter than the through holes 105c serves to resist in the compressing direction against the stress in the direction to strip off the heatsink plate 105 from the upper surface of the substrate 101 (elongating direction), thereby facilitating enduring a greater stress, compared with the conventional structure in which simply the lower surface of the heatsink plate and the upper surface of the substrate are adhered to each other.

The adhesive resin 106 filled in the through holes 105c of the heatsink plate 105 may be constituted of a resin of relatively low elasticity, for example in a range of 0.01 GPa to 0.1 GPa in elastic modulus. The resin of such low elastic modulus incurs elastic deformation when the stress is applied in the direction to strip off the heatsink plate 105 from the upper surface of the substrate 101 (elongating direction), thereby absorbing the energy of the stress applied to the adhesive resin 106, to the extent of the elastic deformation.

Also, a volume of the adhesive resin 106 filled in the through holes 105c considerably decreases not a little when hardened by the heat treatment, and hence a gap is created inside the through holes 105c between the inner wall thereof and the adhesive resin 106. On the other hand, during the reflow process the semiconductor device is warped to thereby generate a stress in a direction to cause a positional shift between the heatsink plate 105 and the substrate 101, and such stress is applied to the adhesive resin 106. Actually, however, the positional shift between the heatsink plate 105 and the substrate 101 takes place in the gap inside the through holes 105c. Therefore, the energy of the stress in the direction to cause the positional shift is compensated by the positional shift inside the through holes 105c, and thus the stress applied to the adhesive resin 106 is alleviated.

The semiconductor device according to this embodiment provides the following advantageous effects. In the foregoing semiconductor device, as already stated, the heatsink plate 105 has both the upper and lower surfaces of the fixing section 105b sandwiched by the adhesive resin 106. Such structure provides an increased adhesion area between the heatsink plate 105 and the upper surface of the substrate 101, thereby securing much enough fixing strength compared with the conventional structure in which simply the lower surface of the heatsink plate and the upper surface of the substrate are adhered to each other. Also, the adhesive resin 106 applied to the upper surface of the fixing section 105b in a larger diameter than the through holes 105c serves to resist in the compressing direction against the stress in the direction to strip off the heatsink plate 105 from the upper surface of the substrate 101 (elongating direction), thereby facilitating enduring a greater stress, compared with the conventional structure that merely depends on the anchor effect of the adhesive resin. Consequently, the heatsink plate 105 effectively serves to dissipate the heat without being stripped off from the substrate 101, thereby securing the reliability on the performance of the semiconductor chip 102.

Second Embodiment

The semiconductor device according to this embodiment basically has a similar structure to that of the semiconductor device according to the first embodiment, except for filling an adhesive resin of a low elastic modulus in the through holes of the heatsink plate but providing an adhesive resin of a higher elastic modulus in the remaining portions, thereby facilitating enduring greater strength while maintaining the foregoing stress-relief effect.

Figure 3:
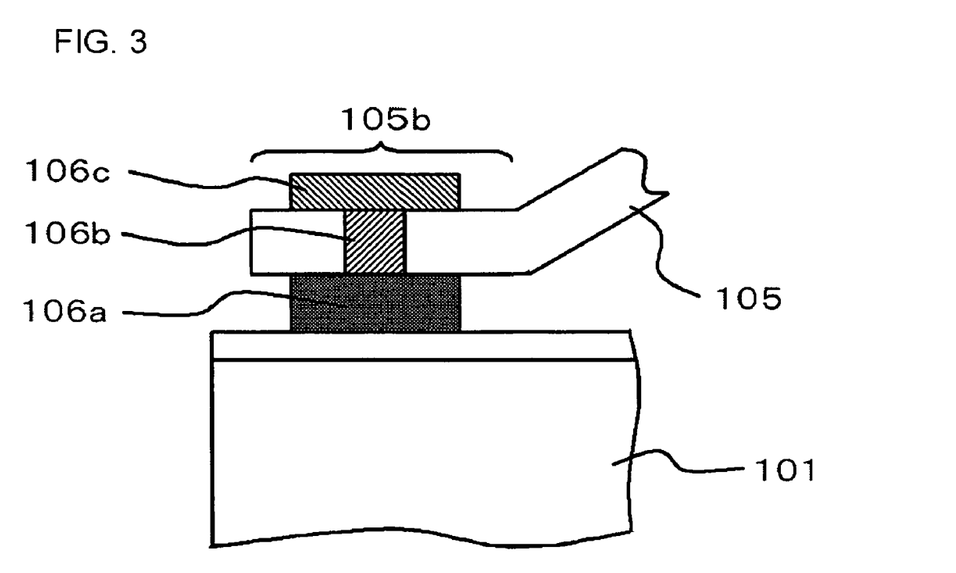
FIG. 3 is an enlarged fragmentary vertical cross-sectional view of a semiconductor device according to a second embodiment of the present invention.

Firstly, a structure of the semiconductor device will be described. FIG. 3 is an enlarged fragmentary vertical cross-sectional view of the semiconductor device according to this embodiment.

As shown in FIG. 3, in the semiconductor device the heatsink plate 105 is fixed to the upper surface of the substrate 101 via an adhesive resin 106a provided in the gap between the lower surface of the fixing section 105b and the upper surface of the substrate 101 in a larger diameter than the through hole 105c, an adhesive resin 106b filled in the through hole 105c of the fixing section 105b, and an adhesive resin 106c provided on the upper surface of the fixing section 105b in a larger diameter than the through hole 105c so as to cover the through hole 105c. Here, when the elastic modulus of the adhesive resin 106a, the adhesive resin 106b and the adhesive resin 106c is denoted by EA, EB, EC respectively, the relationship of EB≦EA, as well as EB≦EC is satisfied. In other words, the adhesive resin 106b filled in the through hole 105c has a lower elastic modulus than the adhesive resin 106a, 106c provided in other portions. More specifically, the elastic modulus EB of the adhesive resin 106b may be in a range of 0.01 GPa to 0.1 GPa. Provided that the elastic modulus EB of the adhesive resin 106b is within the range of 0.01 GPa to 0.1 GPa, the adhesive resin 106b incurs elastic deformation during the reflow process, thereby absorbing the energy of the stress applied to the adhesive resins 106a to 106c.

The following passages cover a method of manufacturing the semiconductor device according to this embodiment.

(1) Firstly the adhesive agent 107 is applied to the upper surface of the semiconductor chip 102.

(2) A necessary amount of the adhesive resin 106a is applied beforehand to the upper surface of the substrate 101, at positions where the through holes 105c of the fixing section 105b are to be located when the heatsink plate 105 is placed. More specifically, such amount of the adhesive resin 106a, that intrudes halfway into the through hole 105c when the heatsink plate 105 is placed on the upper surface of the substrate 101, is to be applied.

(3) The heatsink plate 105 is placed on the substrate 101 so as to cover the semiconductor chip 102. At this moment, the lower surface of the recessed portion 105a of the heatsink plate 105 is pressed against the adhesive agent 107 applied to the upper surface of the semiconductor chip 102.

(4) The adhesive resin 106b is filled in the through holes 105c of the heatsink plate 105.

(5) Further, the adhesive resin 106c is applied to the upper surface of the fixing section 105b of the heatsink plate 105, in a larger diameter than the through holes 105c, so as to cover the through holes 105c.

(6) Heat treatment is then performed, to thereby harden the adhesive resins 106a to 106c. As a result, the fixing section 105b of the heatsink plate 105 is fixed to the upper surface of the substrate 101, via the adhesive resins 106a to 106c.

Through these steps, the semiconductor device shown in FIG. 3 can be obtained.

The adhesive resin 106a and the adhesive resin 106c may be provided so as to slightly intrude into the through holes 105c of the heatsink plate 105. Such arrangement brings the bonding interfaces between the adhesive resins 106a, 106c and the adhesive resin 106b, which have relatively low strength, into inside of the through holes 105c, instead of the upper and lower surfaces of the fixing section 105b of the heatsink plate 105, thereby granting greater strength against an external force.

The semiconductor device according to this embodiment provides the following advantageous effects. It is apparent that the semiconductor device according to this embodiment provides the similar advantageous effects to those offered by the semiconductor device according to the first embodiment. Thus, in the foregoing semiconductor device also, the heatsink plate 105 has both the upper and lower surfaces of the fixing section 105b sandwiched by the adhesive resins 106a to 106c. Such structure provides an increased adhesion area between the heatsink plate 105 and the upper surface of the substrate 101, thereby securing much enough fixing strength compared with the conventional structure in which simply the lower surface of the heatsink plate and the upper surface of the substrate are adhered to each other. Also, the adhesive resin 106c applied to the upper surface of the fixing section 105b in a larger diameter than the through holes 105c serves to resist in the compressing direction against the stress in the direction to strip off the heatsink plate 105 from the upper surface of the substrate 101 (elongating direction), thereby facilitating enduring a greater stress, compared with the conventional structure that merely depends on the anchor effect of the adhesive resin.

Further, in the semiconductor device according to this embodiment, the adhesive resin 106a provided in the gap between the lower surface of the fixing section 105b and the upper surface of the substrate 101 in a larger diameter than the through hole 105c, and the adhesive resin 106c provided on the upper surface of the fixing section 105b in a larger diameter than the through hole 105c have higher elastic modulus than the adhesive resin 106b filled in the through hole 105c of the fixing section 105b. Accordingly, the adhesive resins 106a and 106c (especially the adhesive resin 106c) are less susceptible to deformation even when a greater stress is applied in the direction to strip off the heatsink plate 105 from the upper surface of the substrate 101 (elongating direction) in the cooling phase of the reflow process (from low to room temperature), and consequently the heatsink plate 105 can be prevented from coming off from the adhesive resins 106a to 106c.

Third Embodiment

The semiconductor device according to this embodiment basically has a similar structure to that of the semiconductor device according to the first and the second embodiment, except that the fixing section of the heatsink plate includes a recessed groove in addition to the through holes, both of which are filled with the resin so that the heatsink plate is fixed to the upper surface of the substrate with still greater strength.

Figure 4A:
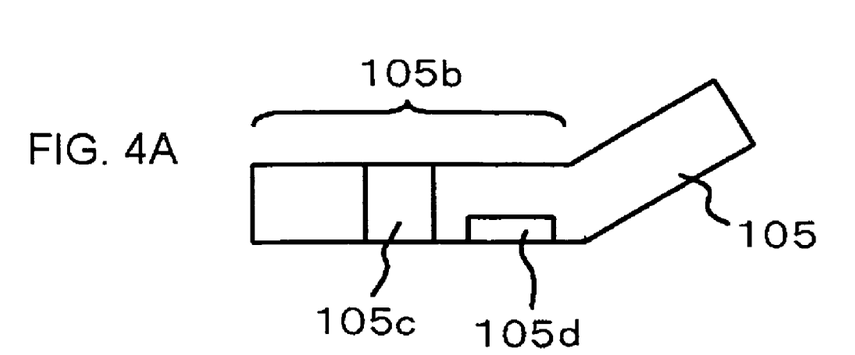
FIG. 4A is an enlarged fragmentary vertical cross-sectional view and FIG. 4B is an enlarged fragmentary plan view, each showing a heatsink plate of a semiconductor device according to a third embodiment of the present invention.

Firstly, a structure of the semiconductor device will be described. FIG. 4A is an enlarged fragmentary vertical cross-sectional view and FIG. 4B is an enlarged fragmentary plan view, each showing the heatsink plate of the semiconductor device according to this embodiment.

Figure 4B:
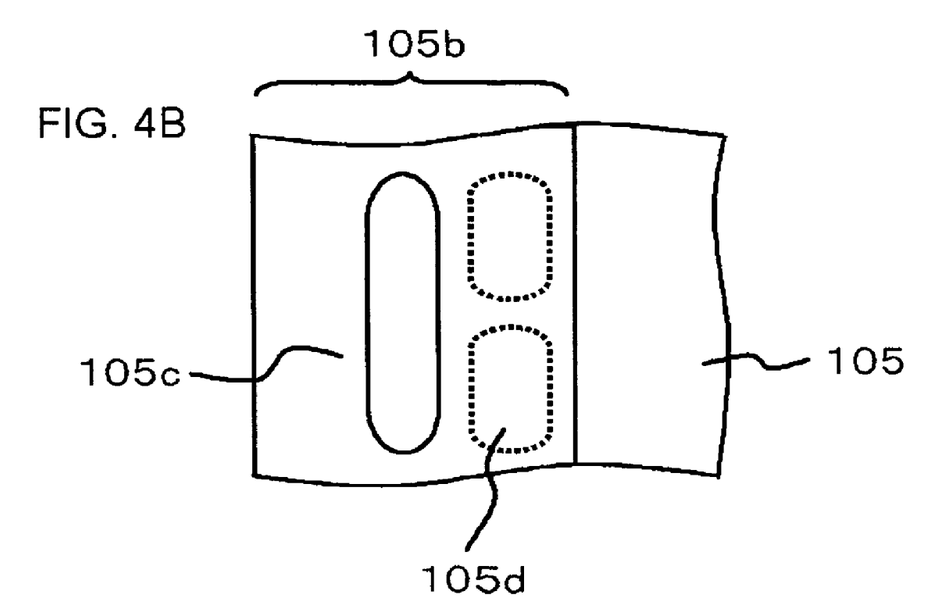

As shown in FIGS. 4A and 4B, the heatsink plate 105 of this semiconductor device includes a plurality of through holes 105c along the periphery of the fixing section 105b, as well as a plurality of recessed grooves 105d formed on the lower surface of the fixing section 105b along the periphery thereof, so that filling the resin in the through holes and the recessed grooves allows fixing the heatsink plate 105 to the upper surface of the substrate 101 with still greater strength. The recessed grooves 105d may be of a rectangular, a circular or an elliptical shape, as the through holes 105c. Also, the recessed grooves 105d may be of a shape that reaches the outer edge of the heatsink plate 105, as the through holes 105c. The number of the recessed grooves 105d may be just one, in the case where the recessed groove is formed in a C-shape throughout three sides along the periphery of the heatsink plate 105.

A method of manufacturing the semiconductor device according to this embodiment will now be described hereunder. The manufacturing method is basically similar to those of the first and the second embodiment, except for the step of placing the heatsink plate 105 on the upper surface of the substrate 101, in which:

(1) A necessary amount of the adhesive resin 106a is applied beforehand to the upper surface of the substrate 101, at positions where the through holes 105c and the recessed grooves 105d of the fixing section 105b are to be respectively located when the heatsink plate 105 is placed;

(2) The heatsink plate 105 is placed on the substrate 101 so as to cover the semiconductor chip 102. At this moment, the lower surface of the fixing section 105b of the heatsink plate 105 is pressed against the adhesive resin 106a applied to the upper surface of the substrate 101, so that the adhesive resin 106a is expanded to occupy a larger area than each of the through holes 105c, and is also filled in the recessed grooves 105d;

(3) The adhesive resin 106b is filled in the through holes 105c of the heatsink plate 105;

(4) Further, the adhesive resin 106c is applied to the upper surface of the fixing section 105b of the heatsink plate 105, in a larger diameter than the through holes 105c, so as to cover the through holes 105c; and (5) Heat treatment is then performed, to thereby harden the adhesive resins 106a to 106c. As a result, the fixing section 105b of the heatsink plate 105 is fixed to the upper surface of the substrate 101, via the adhesive resins 106a to 106c.

Through these steps, the semiconductor device according to this embodiment can be obtained.

The semiconductor device according to this embodiment provides the following advantageous effects. It is apparent that the semiconductor device according to this embodiment provides the similar advantageous effects to those offered by the semiconductor device according to the first and the second embodiment. Thus, in the foregoing semiconductor device also, the heatsink plate 105 has both the upper and lower surfaces of the fixing section 105b sandwiched by the adhesive resins 106a to 106c. Such structure provides an increased adhesion area between the heatsink plate 105 and the upper surface of the substrate 101, thereby securing enough much fixing strength compared with the conventional structure in which simply the lower surface of the heatsink plate and the upper surface of the substrate are adhered to each other. Also, the adhesive resin 106c applied to the upper surface of the fixing section 105b in a larger diameter than the through holes 105c serves to resist in the compressing direction against the stress in the direction to strip off the heatsink plate 105 from the upper surface of the substrate 101 (elongating direction), thereby facilitating enduring a greater stress, compared with the conventional structure that merely depends on the anchor effect of the adhesive resin.

Moreover, in the semiconductor device according to this embodiment, the heatsink plate 105 is fixed to the upper surface of the substrate 101 additionally via the adhesive resin 106a loaded in the recessed grooves 105d formed on the lower surface of the fixing section 105b of the heatsink plate 105, which leads to further increased adhesion area thereby fixing the heatsink plate 105 to the substrate 101 with still greater strength.

The semiconductor device according to the present invention, so far described based on the first to the third embodiments referring to the accompanying drawings, provides the following secondary effects. For example, even when an excessive amount of adhesive resin is applied to the substrate surface, the adhesive resin can escape into the through hole of the heatsink plate, thereby being prevented from flowing out to the periphery of the substrate. Accordingly, dimensional yield of the substrate can be improved. Further, since greater fixing strength of the heatsink plate to the substrate is achieved in all the foregoing embodiments, the adhesion area of the heatsink plate may be reduced in proportion to the increase in strength. This consequently leads to a reduced package size of the semiconductor device.

It is to be understood that the foregoing embodiments of the present invention are merely exemplary, and that various other arrangement may be made. To cite a few examples, the step of providing the adhesive resin on the upper surface of the fixing section of the heatsink plate, in a larger diameter than the through hole so as to cover the through hole, may be skipped. In this case, a larger adhesion area of the heatsink plate can still be secured greater fixing strength than in the conventional structure, and hence the heatsink plate can be fixed to the upper surface of substrate with greater strength. Also, the step of filling the adhesive resin in the through holes of the heatsink plate and the step of applying the adhesive resin on the upper surface of the fixing section of the heatsink plate, in a larger diameter than the through hole so as to cover the through hole, may be performed at a time. In this case, an excessive amount of adhesive resin may be filled in the through holes of the heatsink plate, so that the adhesive resin overflows out of the through holes.

It is apparent that the present invention is not limited to the above embodiment, and may be modified and changed without departing from the scope and spirit of the invention.

What is claimed is:

1. A semiconductor device comprising:
    a substrate;
    a semiconductor chip mounted on said substrate; and
    a heatsink plate covering said semiconductor chip and fixed to said substrate, said heatsink plate having a fixing surface and an opposite surface, the opposite surface facing opposite the fixing surface,
    wherein said heatsink plate includes at least one bored portion formed on the fixing surface configured to be fixed to said substrate via a resin provided in said bored portion,
    wherein said bored portion is a through hole communicating between said fixing surface to said substrate and to the opposite surface,
    wherein said resin in said bored portion includes i) a first portion provided in a gap between said upper surface of said substrate and said fixing surface, a diameter of said first portion being larger than a diameter of said through hole, ii) a second portion filled in said through hole, and iii) a third portion provided on said opposite surface, a diameter of said third portion being larger than the diameter of said through hole, and
    wherein a relationship of $EB \leq EA$ and $EB \leq EC$ is satisfied, $EA$, $EB$, and $EC$ representing the elastic modulus, respectively, of said first portion, said second portion, and said third portion.

* * * * *